United States Patent [19]
Imai

[11] Patent Number: 5,523,245
[45] Date of Patent: Jun. 4, 1996

[54] PROCESS FOR FABRICATING HIGH-PERFORMANCE FACET-FREE SMALL-SIZED BIPOLAR TRANSISTOR

[75] Inventor: Kiyotaka Imai, Tokyo, Japan

[73] Assignee: NEC Corporation, Japan

[21] Appl. No.: 427,844

[22] Filed: Apr. 26, 1995

[30] Foreign Application Priority Data

May 12, 1994 [JP] Japan .................................. 6-122030

[51] Int. Cl.⁶ ................................................ H01L 21/265
[52] U.S. Cl. ............................. 437/31; 437/89; 437/90; 148/DIG. 11
[58] Field of Search ............................. 437/31, 32, 162, 437/89, 90, 909; 148/DIG. 10, DIG. 11

[56] References Cited

U.S. PATENT DOCUMENTS

| 5,204,276 | 4/1993 | Nakajima et al. | 437/31 |
| 5,244,533 | 9/1993 | Kimura et al. | 437/31 |
| 5,296,391 | 3/1994 | Sato et al. | 437/90 |
| 5,326,718 | 7/1994 | Klose et al. | 437/31 |
| 5,424,228 | 6/1995 | Imai | 437/31 |
| 5,432,104 | 7/1995 | Sato | 437/31 |

FOREIGN PATENT DOCUMENTS 5-206151  8/1993  Japan .

OTHER PUBLICATIONS

"A Self–Aligned Selective MBE Technology for High–Performance Bipolar Transistors" by Sato et al; Technical Digest; pp. 607–610.

Primary Examiner—Tuan H. Nguyen
Attorney, Agent, or Firm—Hayes, Soloway, Hennessey, Grossman, & Hage

[57] ABSTRACT

After a formation of a side wall of silicon nitride on an inner periphery defining an emitter hole passing through a silicon nitride layer and a heavily doped polysilicon base electrode layer, a silicon oxide layer on a collector region is isotropically etched so as to expose an upper surface of the collector region and a bottom surface of an inner peripheral portion of the heavily doped polysilicon base electrode layer, and a ring-shaped hollow space beneath the polysilicon base electrode layer is filled with a piece of polysilicon so that the dopant impurity is diffused from the doped polysilicon layer independently from a selective growth of a base layer over the collector region.

16 Claims, 6 Drawing Sheets

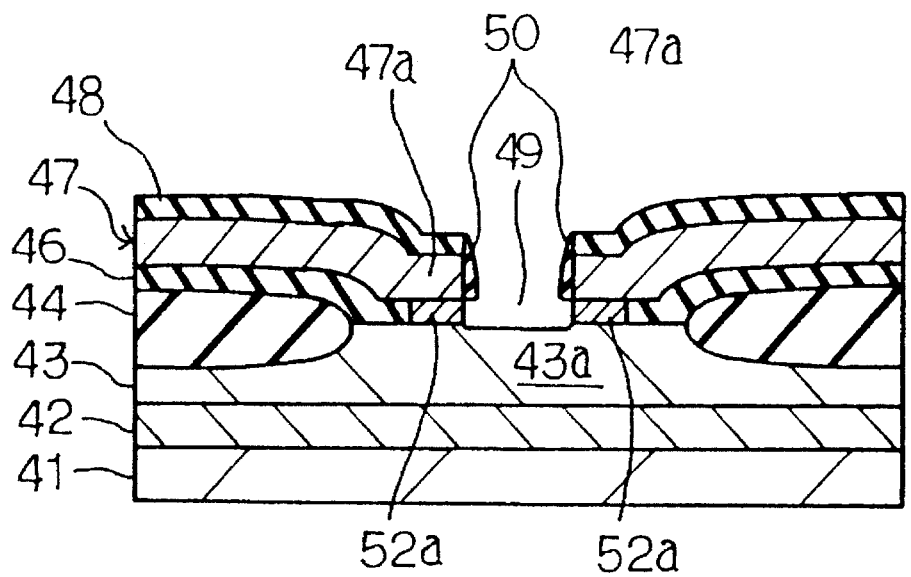
Fig·3D
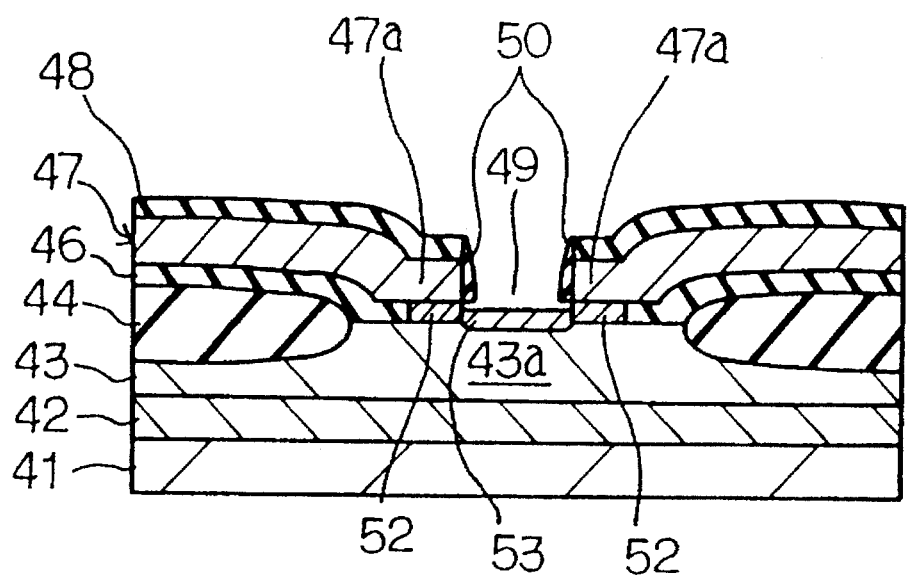
Fig·3E

PROCESS FOR FABRICATING HIGH-PERFORMANCE FACET-FREE SMALL-SIZED BIPOLAR TRANSISTOR

FIELD OF THE INVENTION

This invention relates to a process of fabricating a bipolar transistor and, more particularly, to a process of fabricating a high-performance facet-free small-sized bipolar transistor.

DESCRIPTION OF THE RELATED ART

In general, a thin base region is desirable for a bipolar transistor so as to improve high-frequency characteristics and high withstand voltage characteristics. Conventionally, the base region is formed through ion implantation. However, the conventional bipolar process using ion implantation encounters various problems such as ion channeling, crystal damage and disorder at low acceleration energy, and these problems set a limit on the thickness of the base region.

An epitaxial growth has been proposed to form an extremely thin base region, and can exactly control the thickness and the dopant concentration of the base region. In other words, the epitaxial growth can optimize the base region of a bipolar transistor.

A typical example of a self-aligned bipolar transistor with a base region formed through a selective epitaxial growth is disclosed by Sato et. al., IEDM 90, Technical Digest, pages 607 to 610. FIG. 1 illustrates the self-aligned bipolar transistor disclosed in IEDM 90.

A heavily doped n-type buried layer 1 is grown on a lightly doped p-type silicon substrate 2, and a lightly doped n-type epitaxial layer 3 is grown over the buried layer 1 and the silicon substrate 2.

A silicon oxide layer 4, a heavily doped p-type polysilicon layer 5 and a silicon nitride layer 6 are successively deposited over the lightly doped n-type epitaxial layer 3, and the heavily-doped p-type polysilicon layer 5 is used for a base electrode. An appropriate mask (not shown) is patterned on the silicon nitride layer 6, and the silicon nitride layer 6 and the heavily-doped p-type polysilicon layer 5 are partially etched away for forming an emitter opening.

A first side wall 7 is formed on the inner periphery defining the emitter opening, and the silicon oxide layer 4 is partially etched away by using the silicon nitride layer 6 and the first side wall 7 as an etching mask. The side etching is, thereafter, carried out on the silicon oxide layer 4, and the edge of the silicon oxide layer 4 retreats. As a result, the bottom surface of the heavily doped p-type polysilicon layer 5 is partially exposed.

A p-type epitaxial base layer 8 is grown on the lightly doped n-type epitaxial layer 3, and a p-type polysilicon layer 9 is downwardly grown on the exposed bottom surface of the heavily doped p-type polysilicon layer 5. The epitaxial growth exactly controls the thickness and the dopant concentration of the p-type epitaxial base layer, and the p-type epitaxial base layer 8 is electrically connected through the p-type polysilicon layer 9 to the heavily doped p-type polysilicon layer 8 serving as a base electrode.

A second side wall 10 is formed in the emitter opening, and covers the first side wall 7. A heavily doped n-type polysilicon 11 fills the emitter opening, and the n-type dopant impurity is thermally diffused from the heavily doped n-type polysilicon 11 into the p-type epitaxial base layer 8 so as to form an emitter region 12.

The prior art bipolar transistor described above encounters the problem of a large base resistance due to a small contact area of the heavily doped p-type polysilicon layer 5. If the p-type polysilicon layer 9 is insufficiently grown, the base resistance is further increased due to a large contact resistance between the p-type polysilicon layer 9 and the p-type epitaxial base layer 8.

Another problem inherent in the prior art bipolar transistor is a facet 13, because the silicon oxide layer 4 restricts the growth of the polysilicon. As a result, a void takes place, and decreases the contact area between the p-type epitaxial base layer 8 and the p-type polysilicon layer 9. As a result the base resistance is further increased.

Yet another problem is variation of the impurity profile in the p-type epitaxial base layer 8. The p-type epitaxial polysilicon layer 9 is equal in dopant concentration to the p-type epitaxial base layer 8, and the dopant concentration of the p-type polysilicon layer 9 is increased through thermal diffusion from the heavily doped p-type polysilicon layer 5 so as to lower the base resistance. However, the heat treatment affects the impurity profile in the p-type epitaxial base layer 8, and the transistor characteristics are affected by the varied impurity profile in the p-type epitaxial base layer 8.

Thus, although an extremely thin base region is achieved by the epitaxial growing technique, the bipolar transistor disclosed in the IEDM paper has the above described problems.

The present inventor has proposed an improved fabrication process of a bipolar transistor in Japanese Patent Publication of Unexamined Application No. 5-206151. The proposed fabrication process is described hereinbelow with reference to FIGS. 2A to 2F.

The prior art process sequence starts with preparation of a lightly doped p-type silicon substrate 20, and the resistivity of the lightly doped p-type silicon substrate 20 is regulated to about 1 ohm-cm. Arsenic ion is implanted into the lightly doped p-type silicon substrate 20, and forms a heavily doped buried layer 21 in a surface portion of the lightly doped p-type silicon substrate 20. A lightly doped n-type epitaxial layer 22 is grown to thickness of 1.0 to 1.8 microns, and the dopant concentration of the lightly doped n-type epitaxial layer 22 ranges from $5\times10^{15} cm^{-3}$ to $1\times10^{16} cm^{-3}$. The lightly doped n-type epitaxial layer 22 serves as a collector region.

A thick field oxide layer 23 is selectively grown through a local oxidation of silicon technology, and defines a device area. A silicon oxide layer 24 is formed to a thickness of 40 nanometers to 140 nanometers over the entire surface of the structure as shown in FIG. 2A, and the thickness of the silicon oxide layer 24 is dependent on the thickness of an epitaxial layer described hereinlater.

An appropriate mask (not shown) is provided on the silicon oxide layer 24 through lithographic techniques, and the silicon oxide layer 24 is partially etched away by using a dry etching technique. The silicon oxide layer 24 is left on a central sub-area of the device area, and the peripheral sub-area is uncovered with the silicon oxide layer 24 as shown in FIG. 2B.

A heavily doped p-type polysilicon layer 25 and a silicon nitride layer 26 are successively deposited over the entire surface of the structure, and the heavily doped p-type polysilicon layer 25 serves as a base electrode. An appropriate mask (not shown) is provided on the silicon nitride layer 26, and the silicon nitride layer 26 and the heavily doped p-type polysilicon layer 25 are partially etched away by using a dry etching technique. As a result, an emitter hole 27 is formed in the silicon nitride layer 26 and the heavily doped p-type polysilicon layer 25, and the silicon oxide layer 24 on the central sub-area is exposed to the emitter hole 27 as shown in FIG. 2C.

The structure shown in FIG. 2C is placed in a high temperature atmosphere, and the p-type impurity is diffused from the heavily doped p-type polysilicon layer 25 into the lightly doped n-type epitaxial layer 22. As a result, a heavily doped p-type extrinsic base region 28 is formed in the peripheral sub-area of the device area.

A first side wall 29 of silicon nitride is formed on the inner wall defining the emitter hole 27, and the silicon oxide 24 over the central sub-area of the device area is removed by using a wet etching technique. The emitter hole 27 spreads into the lower portion of the heavily doped p-type epitaxial layer 25. The resultant structure of this stage is illustrated in FIG. 2D.

Subsequently, single crystal silicon and poly-crystal silicon are concurrently grown on the exposed upper surface of the lightly doped n-type epitaxial layer 22 and the exposed bottom surface of the heavily doped p-type polysilicon layer 25, respectively, by using an ultra high-vacuum chemical vapor deposition technique or a molecular beam epitaxial technique. Although silicon is not grown on the silicon nitride layer 26 and the first side wall 29, a p-type polysilicon layer 30 and a p-type single-crystal epitaxial base layer 31 are respectively grown on the exposed bottom surface of the heavily doped p-type polysilicon layer 25 and the exposed upper surface of the lightly doped n-type epitaxial layer 22, and the p-type single-crystal epitaxial base layer 31 is merged with the p-type polysilicon layer 30. Thus, the p-type single-crystal epitaxial base layer 31 is electrically connected through the p-type polysilicon layer 30 to the bottom surface of the heavily doped p-type polysilicon layer 25 and directly to the side surface of the heavily doped p-type polysilicon layer 25. As a result, the contact area between the p-type single crystal epitaxial base layer 31 and the heavily doped p-type polysilicon layer 25 is rather wide than that of the bipolar transistor shown in FIG. 1. Moreover, the p-type single crystal epitaxial base layer 31 is contiguous to the side surface of the heavily doped p-type polysilicon layer 25, and, accordingly, a facet does not take place in the boundary therebetween. The resultant structure of this stage is illustrated in FIG. 2E.

A second side wall of silicon oxide is formed over the first side wall 29, and a heavily doped polysilicon is patterned into an emitter electrode 33. The n-type dopant impurity is thermally diffused from the heavily doped n-type polysilicon emitter electrode 33 into a surface portion of the p-type single crystal epitaxial base layer 31, and a heavily doped n-type emitter layer 34 is formed beneath the emitter electrode 33.

The prior art bipolar transistor shown in FIG. 2F is free from a facet, and the base resistance is relatively small than that of the prior art bipolar transistor shown in FIG. 1. However, the device area of the bipolar transistor shown in FIG. 2F is wider than that of the bipolar transistor shown in FIG. 1, because the silicon oxide layer 24 over the central sub-area requires a nesting tolerance with respect to the inner edge of the thick field oxide layer 23.

Another problem is a trade-off between the base resistance and the transistor characteristics. As described hereinbefore, the base resistance is somewhat improved by virtue of the increased contact area between the p-type single crystal epitaxial base layer 31 and the heavily doped p-type polysilicon layer 25. However, the p-type polysilicon layer 30 is equal in dopant concentration to the p-type single crystal epitaxial base layer 31, and is smaller in dopant concentration than the heavily doped p-type polysilicon layer 25. For this reason, if the base resistance is expected to be smaller than that of the second prior art device, a heat treatment is necessary so as to thermally diffuse the p-type impurity from the heavily doped p-type polysilicon layer 25 into the p-type polysilicon layer 30. However, the heat treatment destroys the impurity profile in the p-type single crystal epitaxial base layer 31, and varies the transistor characteristics.

SUMMARY OF THE INVENTION

It is therefore an important object of the present invention to provide a process of fabricating a bipolar transistor which is small in occupied area and low in base resistance without sacrifice of transistor characteristics.

To accomplish the object, the present invention proposes to fill a hollow space beneath a base electrode layer with a semiconductor material before a selective growth of a base layer.

In accordance with one aspect of the present invention, there is provided a process of fabricating a semiconductor device on a collector layer of a first conductivity type defined by an isolating region, comprising the steps of: a) successively depositing a first insulating layer, a polysilicon base electrode layer of a second conductivity type and a second insulating layer selective from the first insulating layer in an etchant over the collector layer; b) partially etching the second insulating layer and the polysilicon base electrode layer for forming an emitter hole over a central area of the collector layer; c) depositing an insulating material selective from the first insulating layer in the etchant; d) forming a first side wall on an inner peripheral wall defining the emitter hole by using an etching back technique; e) partially etching the first insulating layer for exposing a part of the collector layer and forming a hollow space beneath the polysilicon base electrode layer, the hollow space having a lateral length; f) depositing one of polysilicon and amorphous silicon; g) etching the one of the polysilicon and the amorphous silicon in such a manner that a piece of the polysilicon or the amorphous silicon is left in the hollow space; and h) epitaxially growing a base layer of the second conductivity type on an exposed area of the collector layer.

In accordance with another aspect of the present invention, there is provided a process of fabricating a semiconductor device having a bipolar transistor, comprising the steps of: a) preparing a substrate having a collector region of a first conductivity type defined by an isolating region; b) successively depositing a first insulating layer of a first insulating material, a base electrode layer of a first semiconductor material and a second insulating layer of a second insulating material selective to the first insulating material in an etchant over at least the collector region; c) forming an emitter hole in the second insulating layer and the base electrode layer so as to expose a central area of the first insulating layer; d) forming a first side wall of a third insulating material on an inner periphery of the base electrode layer defining the emitter hole, the third insulating material being selective to the first insulating material in the etchant; e) etching the central area and a peripheral area of the first insulating layer by using the etchant so as to form a hollow space beneath an inner peripheral portion of the base electrode layer, the hollow space being contiguous to the emitter hole reaching a central area of the collector region; f) filling the hollow space with a second semiconductor material; g) selectively growing a base layer of a second conductivity type formed of a third semiconductor material on the central area of the collector region, the base layer being merged with the second semiconductor material without a facet; and h) forming an emitter region of the first conductivity type in the base layer.

BRIEF DESCRIPTION OF THE DRAWINGS

The features and advantages of the process of fabricating a bipolar transistor according to the present invention will be more clearly understood from the following description taken in conjunction with the accompanying drawings in which:

FIGS. 3A to 3G are cross sectional views showing a process sequence for fabricating a bipolar transistor according to one embodiment of the present invention.

DESCRIPTION OF THE PREFERRED EMBODIMENT

FIG. 3A to 3G illustrate a process sequence for fabricating a bipolar transistor embodying the present invention. The process starts with preparation of a lightly doped single crystal silicon substrate 41, and the resistivity of the silicon substrate 41 is on the order of 1 ohm-cm. Arsenic or antimony is ion implanted into a surface portion of the single crystal silicon substrate 41, and a heavily doped n-type buried layer 42 is formed in the surface portion of the single crystal silicon substrate 41. The heavily doped n-type buried layer 42 has a thickness of 1 to 2 microns and impurity concentration of $1\times10^{20}cm^{-3}$ to $5\times10^{20}cm^{-3}$.

A lightly doped n-type epitaxial layer 43 is grown over the heavily doped n-type buried layer 42 to a thickness of 1.0 to 1.8 microns, and the impurity concentration of the lightly doped n-type epitaxial layer 43 ranges from $5\times10^{15}cm^{-3}$ to $1\times10^{16}cm^{-3}$. The lightly doped n-type epitaxial layer 43 serves as a collector.

Figure 1:
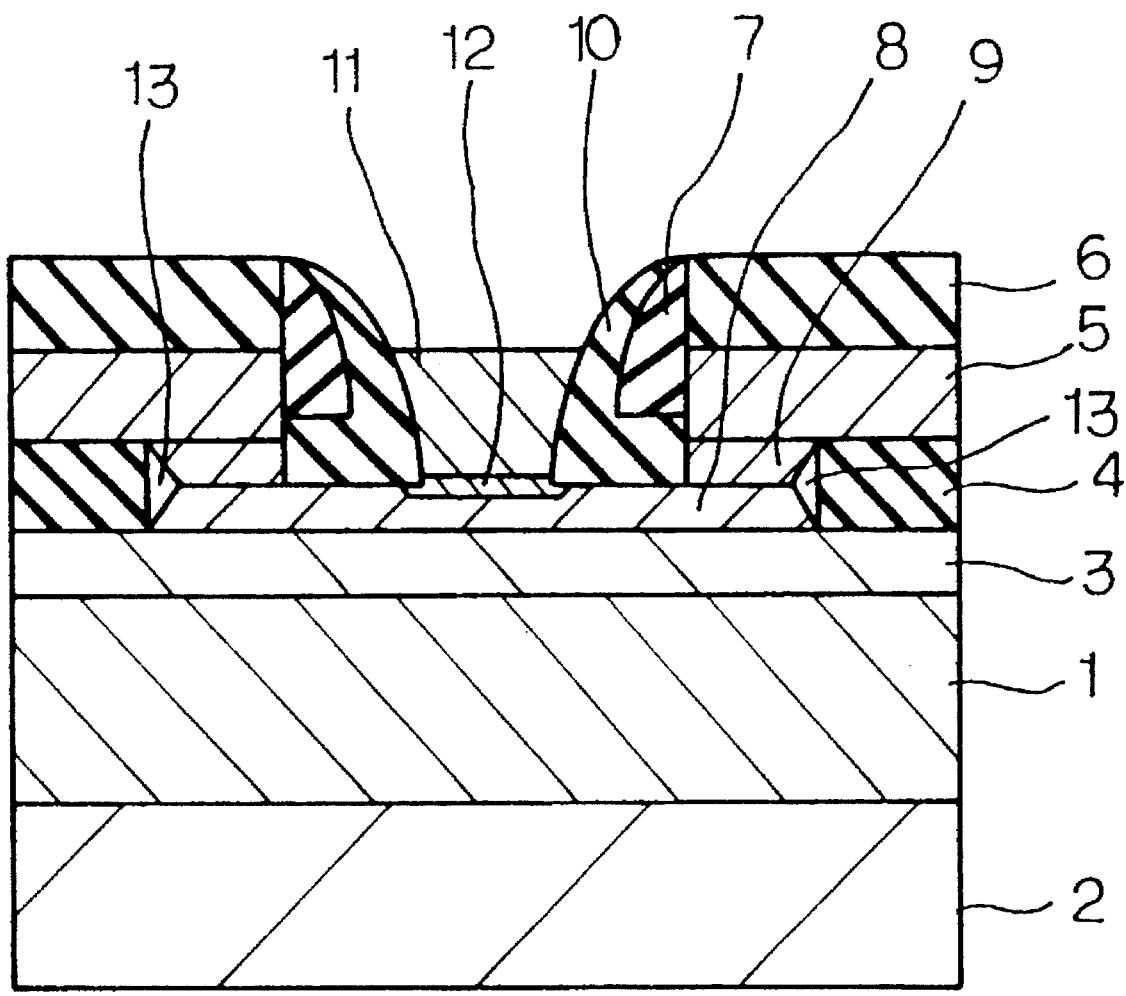
FIG. 1 is a cross sectional view showing the structure of the first prior art bipolar transistor.
Figure 2A:
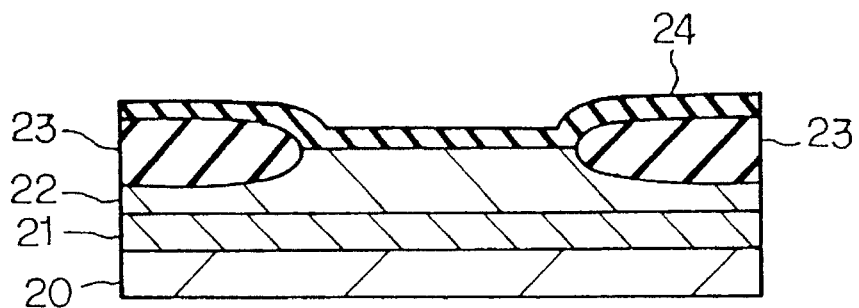
FIGS. 2A to 2F are cross sectional views showing the prior art process sequence for fabricating the second prior art bipolar transistor.
Figure 2B:
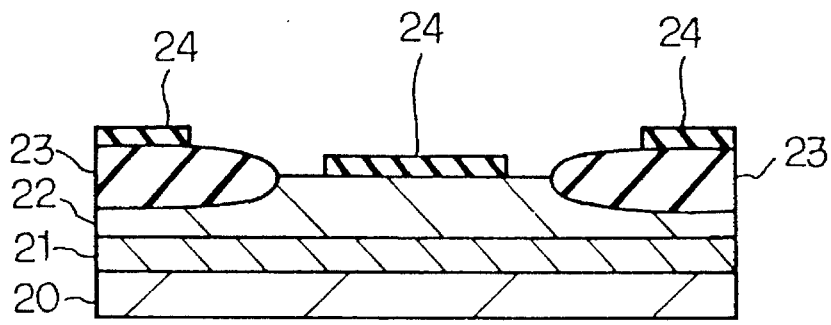
Figure 2C:
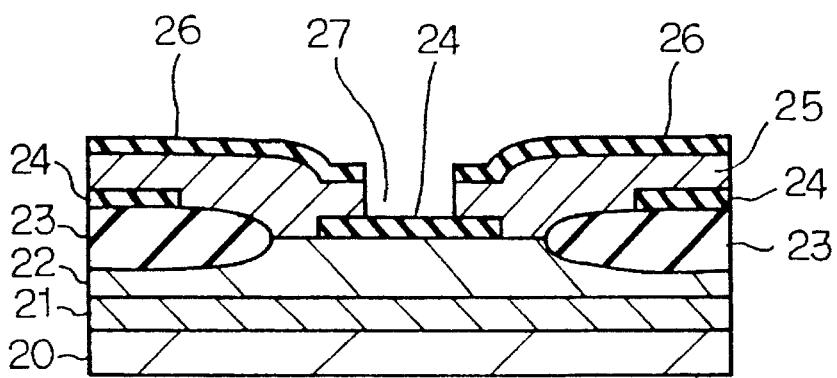
Figure 2D:
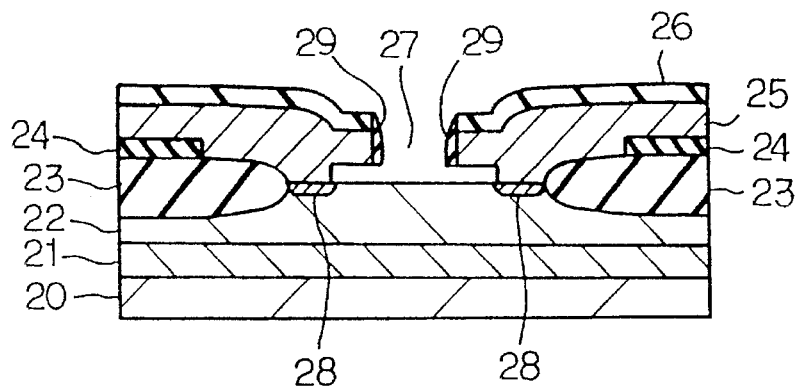
Figure 2E:
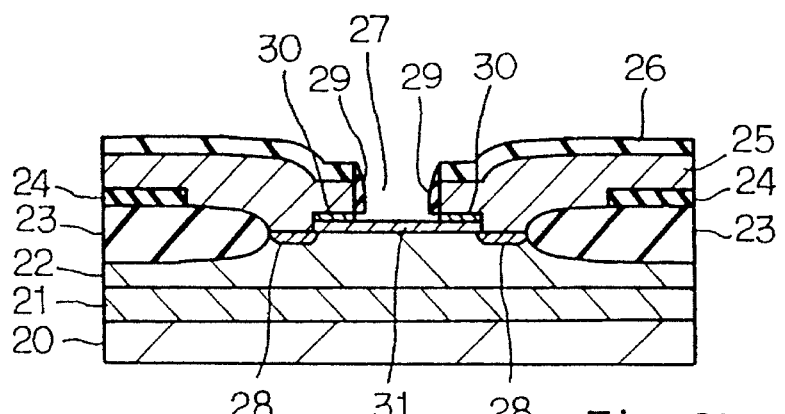
Figure 2F:
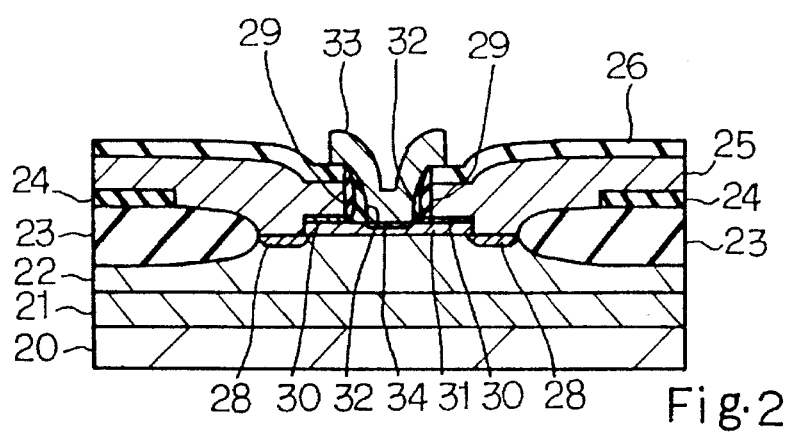
Figure 3A:
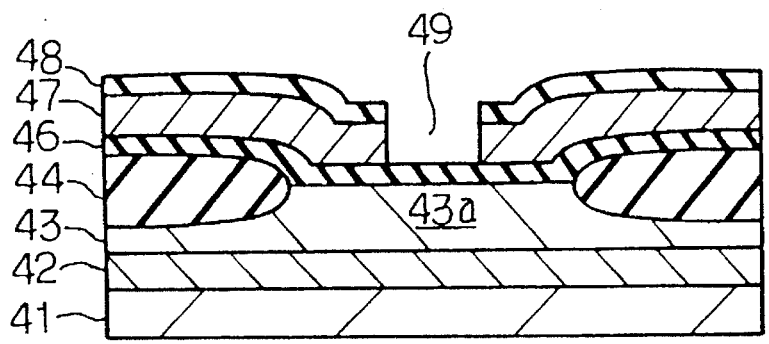

Subsequently, a thick field oxide layer 44 is selectively grown on the heavily doped n-type epitaxial layer 43 through a local oxidation of silicon technology, and defines an active device area 43a, and phosphorus atoms are diffused into the lightly doped n-type epitaxial layer 43 so as to merge a heavily doped n-type collector contact region 45 with the heavily doped n-type buried layer 42 (see FIG. 3G).

Silicon oxide is deposited over the entire surface of the structure, and a silicon oxide layer 46 covers the active area 43a and the thick field oxide layer 44. The thickness of the silicon oxide layer 46 depends upon the thickness of an epitaxial base layer as will be described hereinafter, and ranges from 40 nanometers to 140 nanometers.

Subsequently, a heavily doped p-type polysilicon layer 47 and a silicon nitride layer 48 are successively deposited over the entire surface of the structure, and the heavily doped p-type polysilicon layer 47 is used for a base electrode as will be described hereinlater.

Although not shown an appropriate etching mask is provided on the silicon nitride layer 48 through lithographic techniques, and the silicon nitride layer 48 and the heavily doped p-type polysilicon layer 47 are partially etched away by using a dry etching technique. As a result, an emitter hole 49 is formed in the lamination of the heavily doped p-type polysilicon layer 47 and the silicon nitride layer 48, and exposes a central sub-area of the active device area 43a as shown in FIG. 3A.

Silicon nitride is deposited over the entire surface of the structure, and the silicon nitride layer is anisotropically etched back by using a dry etching so as to form a first side wall 50 on the inner periphery of the lamination defining the emitter hole 49.

The silicon oxide layer 48 exposed to the emitter hole 49 is etched away through a wet etching, and the wet etching is continued for a predetermined time period. In this instance, hydrofluoric acid-based etchant is used in the wet etching, and an example of the hydrofluoric acid-based etchant is expressed as $NH_4F+HF$.

Figure 3B:
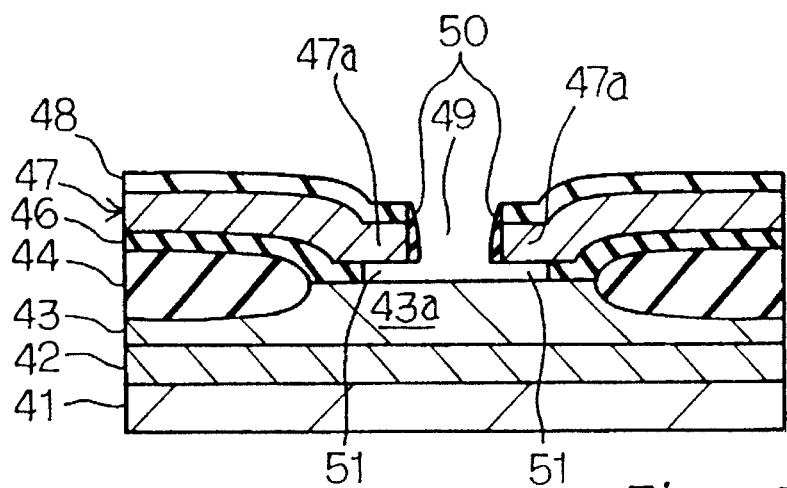

As a result, the silicon oxide layer 46 laterally proceeds, and a ring-shaped hollow space 51 is formed beneath an overhang portion 47a of the heavily doped p-type polysilicon layer 47 as shown in FIG. 3B. The ring-shaped hollow space 51 is 40 to 140 nanometers in height and 100 to 300 nanometers in width. The ring-shaped hollow space 51 can be surely filled with polysilicon at a later stage within the above height and the width range values. The emitter hole 49 and the ring-shaped hollow space 51 expose a part of the lightly doped n-type epitaxial layer 43 in the active device area 43a.

Thus, the etching of the silicon oxide layer 46 is carried out without a mask, and a nesting tolerance is not required for the etching stage of the silicon oxide layer 46.

Figure 3C:
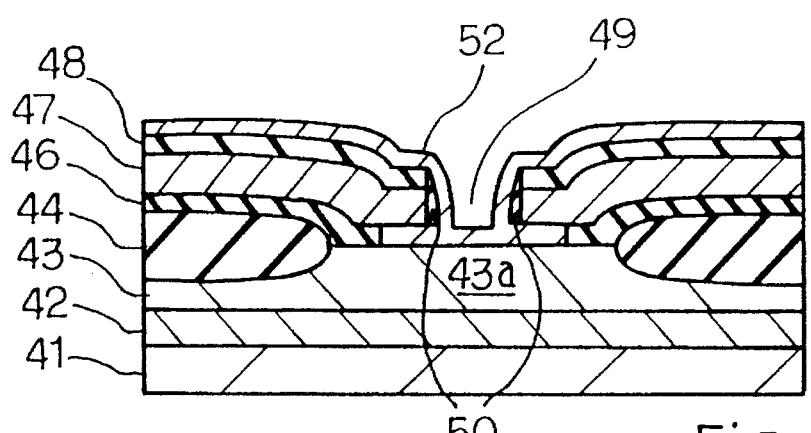

Subsequently, non-doped polysilicon is grown over the entire surface of the structure, and fills the ring-shaped hollow space 51 as shown in FIG. 3C. The thickness of the grown polysilicon layer 52 is dependent on the thickness of the silicon oxide layer 46 and, accordingly, the height of the ring-shaped hollow space 51 both ranging from 40 nanometers to 140 nanometers, and is 50 to 70 percent of the thickness of the silicon oxide layer 46.

The non-doped polysilicon layer 52 is etched away by using an isotropical dry etching, and a ring-shaped polysilicon piece 52a is left in the ring-shaped hollow space 51 beneath the over-hang portion 47a. It is necessary to perfectly remove the polysilicon layer 52 on the silicon nitride layer 48, and the lightly doped n-type epitaxial layer 43 in the central sub-area is over etched by 3 to 9 nanometers in depth as shown in FIG. 3D. The isotropical dry etching damages the silicon crystal less than an anisotropical etching, and has only negligible influence on an epitaxial base layer described hereinbelow.

The resultant structure shown in FIG. 3D is placed in a high temperature atmosphere, and the p-type impurity is thermally diffused from the over-hang portion 47a into the ring-shaped polysilicon piece 52a. Then, the resistivity of the ring-shaped polysilicon piece 52a is decreased.

A p-type single crystal epitaxial base layer 53 is selectively grown on the exposed lightly doped n-type epitaxial layer 43 by using an ultra-high vacuum chemical vapor deposition technique or a molecular beam epitaxy. The impurity concentration of the p-type single crystal epitaxial layer 53 ranges from $1\times10^{18}cm^{-3}$ to $2\times10^{19}$ $cm^{-3}$. A facet does not take place between the ring-shaped polysilicon piece 52a and the p-type epitaxial base layer 53. The resultant structure of this stage is illustrated in FIG. 3E.

Figure 3F:
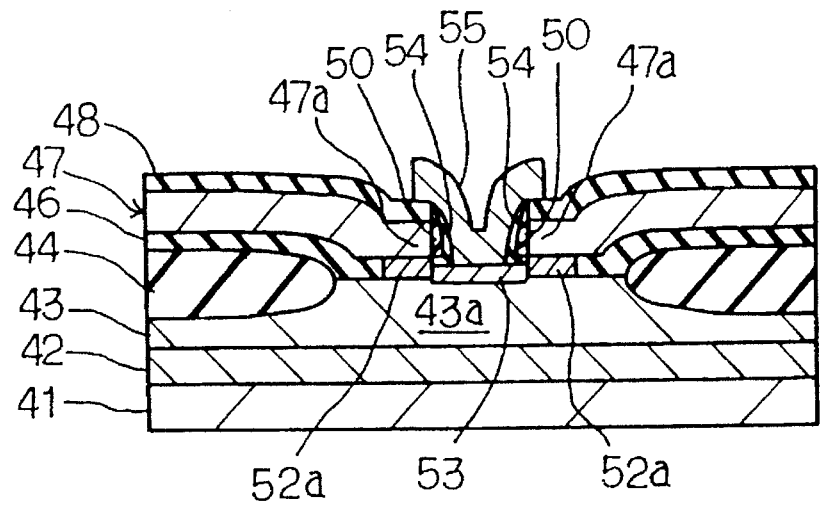
Figure 3G:
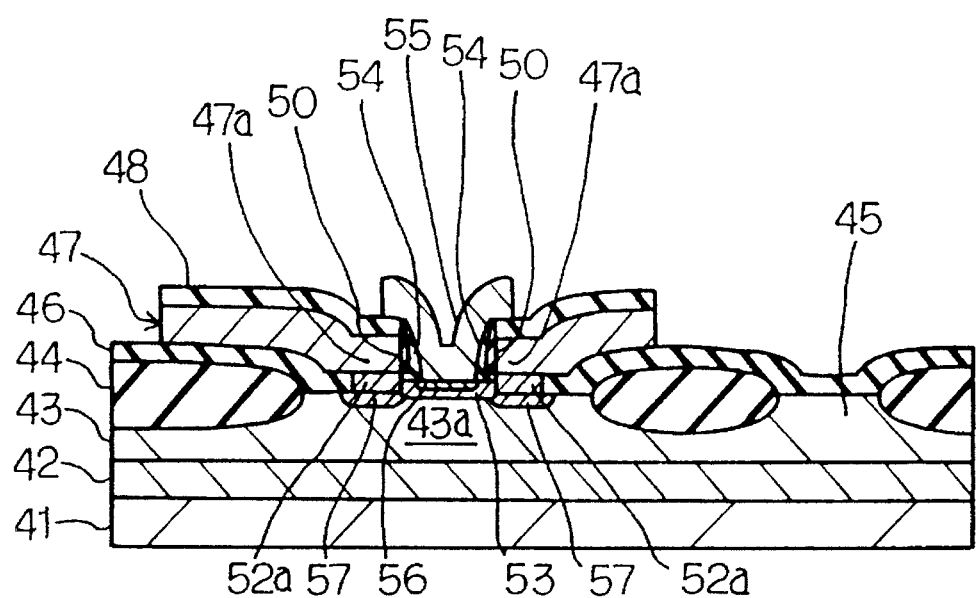

Silicon oxide is deposited over the entire surface of the structure, and is etched back so as to form a second side wall 54 over the first side wall 50. Heavily doped n-type polysilicon is deposited over the entire surface of the structure, and an appropriate mask is provided over the heavily-doped n-type polysilicon layer. Using the mask, the heavily doped n-type polysilicon layer is partially etched away so as to leave an emitter electrode 55 in the emitter hole 49 as shown in FIG. 3F.

A heat treatment is carried out, and the n-type impurity and the p-type impurity are concurrently diffused from the heavily doped n-type emitter electrode 55 and the p-type ring-shaped polysilicon piece 52a into the p-type epitaxial base layer 53 and the lightly doped n-type epitaxial layer 43, respectively. As a result, a heavily-doped n-type emitter region 56 is formed in the p-type epitaxial base layer 53, and a heavily-doped p-type extrinsic base region 57 is further formed in the lightly doped n-type epitaxial layer 43 as shown in FIG. 3G.

In this process sequence, the thick field oxide layer 44 is an isolating region. A first insulating layer, a base electrode layer and a second insulating layer are formed by the silicon oxide layer 46, the p-type polysilicon layer 47 and the silicon nitride layer 48. The second insulating material is identical to the third insulating material in this instance, and both the first and second semiconductor materials are polysilicon.

As will be appreciated from the foregoing description, the process sequence according to the present invention is different from the prior art process sequence disclosed in Japanese Patent Publication of Unexamined Application No. 5-206151 at the following points.

First, the silicon oxide layer 24 is patterned before the formation of the emitter hole 27 in the prior art process, and the silicon oxide layer 24 and the emitter hole 27 require respective masks. On the other hand, the silicon oxide layer 46 is etched in a self-aligned manner with the emitter hole 49, and only one mask is required for the emitter hole 49 and the silicon oxide layer 46. For this reason, only one nesting tolerance is necessary for the bipolar transistor according to the present invention, and the occupied area of the bipolar transistor is decreased.

Second, the p-type epitaxial base layer 31 is grown concurrently with the p-type polysilicon layer 30 in the prior art process. On the other hand, the p-type epitaxial base layer 53 is grown after the formation of the ring-shaped polysilicon piece 52a according to the present invention. The first difference allows the p-type impurity to be diffused at the most appropriate temperature from the heavily doped p-type polysilicon layer 47 into the ring-shaped polysilicon piece 52a before the growth of the p-type epitaxial base layer 53. For this reason, the impurity profile of the p-type epitaxial base layer is never affected by the heat treatment for decreasing the resistivity of the ring-shaped polysilicon piece 52a. This results in enhancement in the production yield and the reliability of the bipolar transistor.

Third, the extrinsic base region 28 and the emitter region 34 are formed through different heat treatment stages in the prior art process. On the other hand, the extrinsic base region 57 and the emitter region 56 are concurrently formed through the heat treatment according to the present invention. As a result, the process sequence according to the present invention is relatively more simple than the prior art process.

The side surfaces of the p-type epitaxial base layer 53 are held in contact with the ring-shaped polysilicon piece, and a facet does not take place as in the prior art process. For this reason, the bipolar transistor fabricated through the process according to the present invention is also free from variation of transistor characteristics due to the facet.

Although a particular embodiment of the present invention has been shown and described, it will be obvious to those skilled in the art that various changes and modifications may be made without departing from the spirit and scope of the present invention.

For example, the ring-shaped polysilicon piece 52a may be formed from a boron-doped polysilicon layer or a boron-doped amorphous silicon layer instead of the non-doped polysilicon layer 52. Although the amorphous silicon may require a heat treatment so as to be converted into polysilicon, the boron doped polysilicon does not require the heat treatment for diffusing the p-type impurity from the heavily doped p-type polysilicon layer 47. If the boron-doped polysilicon is used, the manufacturer can freely select the impurity concentration of the boron-doped polysilicon independently from the p-type epitaxial base layer, and is allowed to adjust he resistivity of the base region to the optimum value.

If a non-doped amorphous silicon is deposited instead of the non-doped polysilicon layer 52, the post heat treatment not only converts the amorphous silicon into the polysilicon but also diffuses the p-type dopant impurity from the heavily doped p-type polysilicon layer 47 into the non-doped amorphous/polysilicon.

The p-type epitaxial base layer 53 may be formed of silicon-germanium. The silicon-germanium is available for the ring-shaped conductive piece beneath the over-hang portion 47a instead of the polysilicon.

The heavily doped n-type emitter region 56 may be formed by using a selective growing technique such as an ultra-high vacuum chemical vapor deposition or a molecular beam epitaxy. Doped silicon or doped silicon carbide may be grown through the selective growing technique.

The above described bipolar transistor is of the n-p-n type. However, a p-n-p type bipolar transistor can be fabricated through the process described hereinbefore by using the opposite dopant impurities.

Finally, the bipolar transistor according to the present invention may form a part of a large scale integrated circuit together with another bipolar transistor or other bipolar/field effect transistors.

What is claimed is:

1. A process of fabricating a semiconductor device on a collector layer of a first conductivity type defined by an isolating region, comprising the steps of:

a) successively depositing a first insulating layer, a polysilicon base electrode layer of a second conductivity type and a second insulating layer selective from said first insulating layer in an etchant over said collector layer;

b) partially etching said second insulating layer and said polysilicon base electrode layer for forming an emitter hole over a central area of said collector layer;

c) depositing an insulating material selective from said first insulating layer in said etchant on said second insulating layer, an inner peripheral wall defining said emitter hole and an area of said first insulating layer exposed to said emitter hole;

d) forming a first side wall on said inner peripheral wall defining said emitter hole from said insulating material by using an etching back technique;

e) partially etching said first insulating layer for exposing a part of said collector layer and forming a hollow space beneath said polysilicon base electrode layer, said hollow space having a lateral length;

f) depositing a silicon selected from the group consisting of polysilicon and amorphous silicon on said second insulating layer, said first side wall and said part of said collector layer so as to fill said hollow space;

g) etching said silicon in such a manner that a piece of said polysilicon or said amorphous silicon is left in said hollow space; and h) epitaxially growing a base layer of said second conductivity type on an exposed area of said collector layer.

2. A process of fabricating a semiconductor device having a bipolar transistor, comprising the steps of:

a) preparing a substrate having a collector region of a first conductivity type defined by an isolating region;

b) successively depositing a first insulating layer of a first insulating material, a base electrode layer of a first semiconductor material and a second insulating layer of a second insulating material selective to said first insulating material in an etchant over at least said collector region;

c) forming an emitter hole in said second insulating layer and said base electrode layer so as to expose a central area of said first insulating layer;

d) forming a first side wall of a third insulating material on an inner periphery of said base electrode layer defining said emitter hole, said third insulating material being selective to said first insulating material in said etchant;

e) etching said central area and a peripheral area of said first insulating layer by using said etchant so as to form a hollow space beneath an inner peripheral portion of said base electrode layer, said hollow space being contiguous to said emitter hole reaching a central area of said collector region; f) filling said hollow space with a second semiconductor material, said step f) including the sub-steps of f-1) depositing said second semiconductor material over the entire surface so as to fill said hollow space, f-2) etching layer of said second semiconductor material through an isotropical dry etching technique by using said second insulating layer and said first side wall as a mask so that a piece of said second semiconductor material is left in said hollow space;

g) selectively growing a base layer of a second conductivity type formed of a third semiconductor material on said central area of said collector region, said base layer being merged with said second semiconductor material without a facet; and h) forming an emitter region of said first conductivity type in said base layer.

3. The process as set forth in claim 2, in which said first insulating material, said first semiconductor material, said second insulating material and said third insulating material are a silicon oxide, a polysilicon doped with impurity atoms of said second conductivity type, a silicon nitride and a silicon nitride, respectively.

4. The process as set forth in claim 2, in which said first insulating layer has a thickness ranging from 40 nanometers to 140 nanometers depending upon a thickness of said base layer.

5. The process as set forth in claim 2, in which said step d) comprises the sub-steps of d-1) depositing said third insulating material over the entire surface for forming a third insulating layer, and d-2) anisotropically etching said third insulating layer so as to form said first side wall.

6. The process as set forth in claim 2, in which a wet etching technique is used for etching said central area and a peripheral area of said first insulating layer in said step e).

7. The process as set forth in claim 2, in which said second semiconductor material is a non-doped polysilicon, said process further comprising the step of diffusing impurity from said base electrode layer into said piece of second semiconductor material between said step f) and said step g).

8. The process as set forth in claim 2, in which said second semiconductor material is a polysilicon doped with impurity atoms of said second conductivity type.

9. The process as set forth in claim 2, in which said second semiconductor material is an amorphous silicon, said process further comprising the step of a heat treatment between said step f) and said step g) for converting said amorphous silicon to a polysilicon.

10. The process as set forth in claim 9, in which said amorphous silicon is doped with impurity atoms of said second conductivity type.

11. The process as set forth in claim 2, in which said second semiconductor material is a silicon-germanium.

12. The process as set forth in claim 2, in which said third semiconductor material is grown through one of a ultra high vacuum chemical vapor deposition and a molecular beam epitaxy.

13. The process as set forth in claim 12, in which said third semiconductor material is selected from the group consisting of a doped single crystal silicon, a silicon-germanium.

14. The process as set forth in claim 2, in which said step h) comprises the sub-steps of h-1) depositing a fourth semiconductor material doped with impurity atoms of said first conductivity type over the entire surface, a part of a layer of said fourth semiconductor material being held in contact with a part of said base layer, h-2) patterning said layer of said fourth semiconductor material into an emitter electrode, and h-3) applying heat to said emitter electrode so as to diffuse impurity atoms of said first conductivity type into said part of said base layer, thereby forming said emitter region.

15. The process as set forth in claim 2, in which said emitter region is grown by using one of an ultra high vacuum chemical vapor deposition and a molecular beam epitaxy.

16. The process as set forth in claim 15, in which said fourth semiconductor material is selected from the group consisting of a doped silicon and doped silicon carbide.

* * * * *

UNITED STATES PATENT AND TRADEMARK OFFICE
CERTIFICATE OF CORRECTION

PATENT NO. : 5,523,245
DATED : June 4, 1996
INVENTOR(S) : Kiyotaka IMAI

It is certified that error appears in the above-indentified patent and that said Letters Patent is hereby corrected as shown below:

On the title page, item [54], "FOR" should be --OF--.

Claim 2, Col. 9, line 43, please insert --a-- after "etching".

Signed and Sealed this

Twenty-second Day of October, 1996

Attest:

BRUCE LEHMAN

Attesting Officer        Commissioner of Patents and Trademarks